(12) United States Patent
Choi

(10) Patent No.: US 11,101,341 B2
(45) Date of Patent: Aug. 24, 2021

(54) LIGHT-EMITTING DISPLAY DEVICE AND METHOD OF MANUFACTURING THE SAME

(71) Applicant: LG Display Co., Ltd., Seoul (KR)

(72) Inventor: Howon Choi, Paju-si (KR)

(73) Assignee: LG Display Co., Ltd, Seoul (KR)

( * ) Notice: Subject to any disclaimer, the term of this patent is extended or adjusted under 35 U.S.C. 154(b) by 129 days.

(21) Appl. No.: 16/101,827

(22) Filed: Aug. 13, 2018

(65) Prior Publication Data
US 2019/0172898 A1 Jun. 6, 2019

(30) Foreign Application Priority Data
Dec. 5, 2017 (KR) .................. 10-2017-0166243

(51) Int. Cl.
- *H01L 27/32* (2006.01)
- *H01L 51/52* (2006.01)
- *H01L 51/56* (2006.01)
- *H01L 27/12* (2006.01)

(52) U.S. Cl.
CPC ...... *H01L 27/3279* (2013.01); *H01L 27/3246* (2013.01); *H01L 27/3258* (2013.01); *H01L 51/5209* (2013.01); *H01L 51/5225* (2013.01); *H01L 51/5228* (2013.01); *H01L 51/5284* (2013.01); *H01L 51/56* (2013.01); *H01L 27/124* (2013.01); *H01L 27/1248* (2013.01); *H01L 27/322* (2013.01); *H01L 2227/323* (2013.01); *H01L 2251/5315* (2013.01)

(58) Field of Classification Search
CPC ............. H01L 27/3246; H01L 27/3295; H01L 27/3276; H01L 27/3297; H01L 27/3279; H01L 51/5228; H01L 51/5225; H01L 51/5234; H01L 51/5209; H01L 51/5212; H01L 51/5218; H01L 2227/323
See application file for complete search history.

(56) References Cited

U.S. PATENT DOCUMENTS

| | | | |
|---|---|---|---|
| 2011/0198598 A1* | 8/2011 | Kim ................... | H01L 27/3246 257/59 |
| 2014/0183479 A1* | 7/2014 | Park ................... | H01L 27/3218 257/40 |
| 2015/0179718 A1* | 6/2015 | Kim ................... | H01L 51/5228 257/40 |

(Continued)

*Primary Examiner* — Yu Chen
(74) *Attorney, Agent, or Firm* — Morgan, Lewis & Bockius LLP

(57) ABSTRACT

A light-emitting display device includes: a first substrate, a subpixel on the substrate, a contact area on the first substrate, a cover layer including first to third cover layer portions separated from each other, a first passivation layer, the first passivation layer exposing part of the third cover layer portion, a second passivation layer, a pixel electrode layer including a plurality of pixel electrode layer portions including: a first pixel electrode layer portion, and a second pixel electrode layer portion, an organic insulating layer, the organic insulating layer including: an opening exposing part of the first pixel electrode layer, and a contact hole exposing part of the second pixel electrode layer, an organic emissive layer, and a common electrode layer electrically connected to the second pixel electrode layer, wherein the opening includes a first undercut shape and a second undercut shape.

14 Claims, 19 Drawing Sheets

(56) References Cited

U.S. PATENT DOCUMENTS

| | | | |
|---|---|---|---|
| 2016/0079325 A1* | 3/2016 | Lee | H01L 27/3248 257/40 |
| 2016/0149156 A1* | 5/2016 | Kim | H01L 27/3246 257/40 |
| 2018/0120620 A1* | 5/2018 | Shim | H01L 27/3258 |
| 2018/0190934 A1* | 7/2018 | Choi | H01L 27/3258 |

* cited by examiner

LIGHT-EMITTING DISPLAY DEVICE AND METHOD OF MANUFACTURING THE SAME

CROSS-REFERENCE TO RELATED APPLICATION(S)

This application claims the benefit of and priority to Korean Patent Application No. 10-2017-0166243, filed on Dec. 5, 2017, the entirety of which is hereby incorporated by reference.

BACKGROUND

1. Technical Field

The present disclosure relates to a light-emitting display device and a method of manufacturing the same.

2. Discussion of the Related Art

The market for displays, which act as an intermediary between users and information, is growing with the development of information technology. Thus, display devices, such as light-emitting displays (LEDs), liquid crystal displays (LCDs), and plasma display panels (PDPs) are increasingly used.

Of the aforementioned displays, a light-emitting display includes a display panel including a plurality of subpixels, a drive part that drives the display panel, and a power supply part that supplies electric power to the display panel. The drive part includes a scan driver that supplies scan signals (or gate signals) to the display panel and a data driver that supplies data signals to the display panel.

In the light-emitting display, when scan signals, data signals, etc. are supplied to subpixels arranged in a matrix, the light-emitting diodes of selected subpixels emit light, thereby displaying an image. The light-emitting display may be classified as a "bottom-emission" type that emits light toward a first substrate or a "top-emission" type that emits light toward a second substrate. The light-emitting displays of the related art still require improvement for large-area applications.

SUMMARY

Accordingly, the present disclosure is directed to a light-emitting display device and a method of manufacturing the same that substantially obviate one or more of the issues due to limitations and disadvantages of the related art.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a light-emitting display device, including: a first substrate, an interlayer insulating layer on the first substrate, a subpixel on the substrate, the subpixel including: a light-emitting area, and a non-light-emitting area, a contact area on the first substrate, a metal layer on the interlayer insulating layer on the first substrate, the metal layer including a plurality of metal layer portions, the plurality of metal layer portions including: first and second metal layer portions disposed separately in the light-emitting area and in the non-light-emitting area, and a third metal layer portion disposed in the contact area, a cover layer including a plurality of cover layer portions including first to third cover layer portions disposed separately and respectively corresponding to the first to third metal layer portions, a first passivation layer covering the third cover layer portion in the contact area, the first passivation layer exposing part of the third cover layer portion, a second passivation layer covering the first cover layer portion and the second cover layer portion, exposing part of the second cover layer portion, covering the first passivation layer, and exposing part of the third cover layer portion, a pixel electrode layer including a plurality of pixel electrode layer portions including: a first pixel electrode layer portion on the second cover layer portion, and a second pixel electrode layer portion on the third cover layer portion, an organic insulating layer on the second passivation layer, the organic insulating layer including: an opening exposing part of the first pixel electrode layer, and a contact hole exposing part of the second pixel electrode layer, an organic emissive layer on the organic insulating layer and the first and second pixel electrode layers, and a common electrode layer on the organic emissive layer, the common electrode layer being electrically connected to the second pixel electrode layer in the contact area, wherein the opening includes a first undercut shape including a recess of the second passivation layer into the bottom of the organic insulating layer partially exposing the bottom of the organic insulating layer, and wherein the contact hole includes a second undercut shape including a recess of the first passivation layer and the second passivation layer into the bottom of the organic insulating layer partially exposing the bottom of the organic insulating layer.

In another aspect, there is provided a first substrate, a subpixel on the substrate, a contact area on the first substrate, a cover layer including a plurality of cover layer portions including first to third cover layer portions, each of the first to third cover layer portions being separated from each other, a first passivation layer covering the third cover layer portion in the contact area, the first passivation layer exposing part of the third cover layer portion, a second passivation layer covering the first cover layer portion and the second cover layer portion, exposing part of the second cover layer portion, covering the first passivation layer, and exposing part of the third cover layer portion, a pixel electrode layer including a plurality of pixel electrode layer portions including: a first pixel electrode layer portion on the second cover layer portion, and a second pixel electrode layer portion on the third cover layer portion, an organic insulating layer on the second passivation layer, the organic insulating layer including: an opening exposing part of the first pixel electrode layer, and a contact hole exposing part of the second pixel electrode layer, an organic emissive layer on the organic insulating layer and the first and second pixel electrode layers, and a common electrode layer on the organic emissive layer, the common electrode layer being electrically connected to the second pixel electrode layer in the contact area, wherein the opening includes a first undercut shape including a recess of the second passivation layer into the bottom of the organic insulating layer partially exposing the bottom of the organic insulating layer, wherein the contact hole includes a second undercut shape including a recess of the first passivation layer and the second passivation layer into the bottom of the organic insulating layer partially exposing the bottom of the organic insulating layer, and wherein a distance between the third cover layer portion and the organic insulating layer is different from a distance between the first cover layer portion and the organic insulating layer.

In another aspect, there is provided a method of manufacturing a light-emitting display device, the method including: providing a first substrate, providing a subpixel on the substrate, the providing the subpixel including: providing a light-emitting area, and providing a non-light-emitting area, providing a contact area on the first substrate, providing a cover layer including providing a plurality of cover layer portions including first to third cover layer portions disposed separate from each other, covering the third cover layer portion in the contact area with a first passivation layer, the first passivation layer exposing part of the third cover layer portion, providing a second passivation layer covering the first cover layer portion and the second cover layer portion, exposing part of the second cover layer portion, covering the first passivation layer, and exposing part of the third cover layer portion, providing a pixel electrode layer including providing a plurality of pixel electrode layer portions including: providing a first pixel electrode layer portion on the second cover layer portion, and providing a second pixel electrode layer portion on the third cover layer portion, providing an organic insulating layer on the second passivation layer, the providing the organic insulating layer including: providing an opening that exposes part of the first pixel electrode layer, and providing a contact hole that exposes part of the second pixel electrode layer, providing an organic emissive layer on the organic insulating layer and the first and second pixel electrode layers, and providing a common electrode layer on the organic emissive layer, the common electrode layer being electrically connected to the second pixel electrode layer, wherein the opening is provided with a first undercut shape formed by recessing the second passivation layer into the bottom of the organic insulating layer to partially expose the bottom of the organic insulating layer, wherein the contact hole is provided with a second undercut shape formed by recessing the first passivation layer and the second passivation layer into the bottom of the organic insulating layer to partially expose the bottom of the organic insulating layer, and wherein the first and second pixel electrode portions are self-aligned.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

Figure 1:
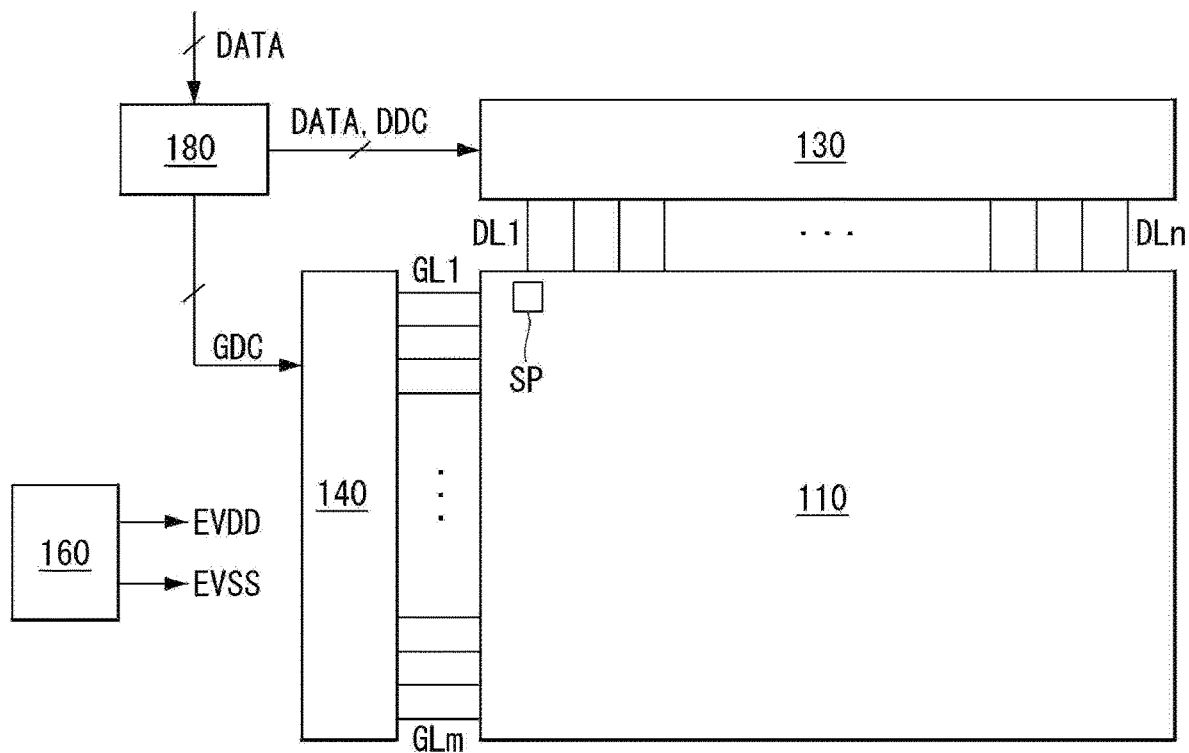
FIG. 1 is a schematic block diagram of an organic light-emitting display.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in a co-dependent relationship.

Hereinafter, a display apparatus according to an embodiment of the present disclosure will be described in detail with reference to the accompanying drawings. In adding reference numerals to elements of each of the drawings, although the same elements are illustrated in other drawings, like reference numerals may refer to like elements.

A light-emitting display device to be described below may be implemented as a television, a video player, a personal computer (PC), a home theater, a smartphone, a virtual reality (VR) device, an augmented reality (AR) device, etc. The light-emitting display device is applicable to an inorganic light-emitting display device based on inorganic light-emitting diodes, as well as an organic light-emitting display device based on organic light-emitting diodes (light-emitting display elements). The following description will be given with respect to an organic light-emitting display device by way of example.

Figure 2:
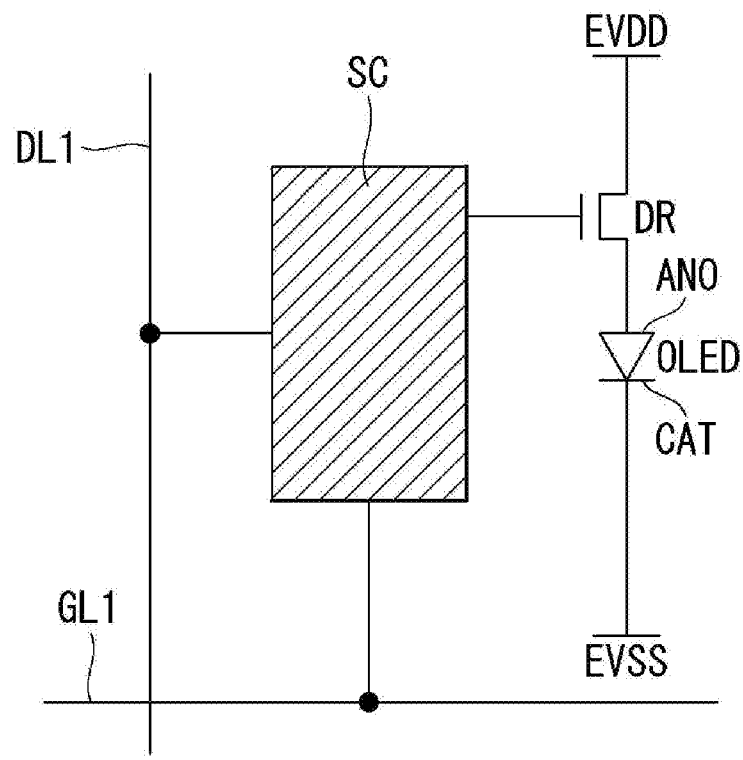
FIG. 2 is a schematic circuit diagram of a subpixel.
Figure 3A:
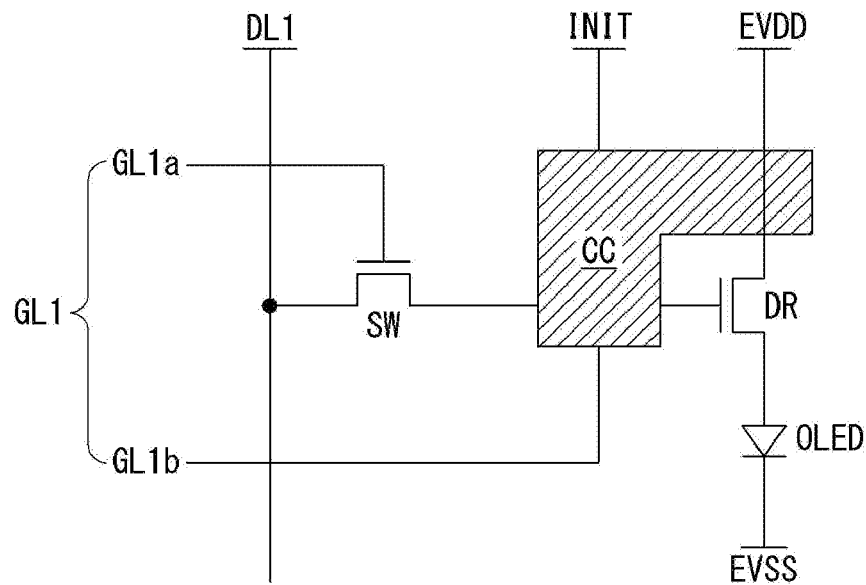
FIGS. 3A and 3B illustrates examples of a detailed circuit configuration of a portion of FIG. 2.
Figure 3B:
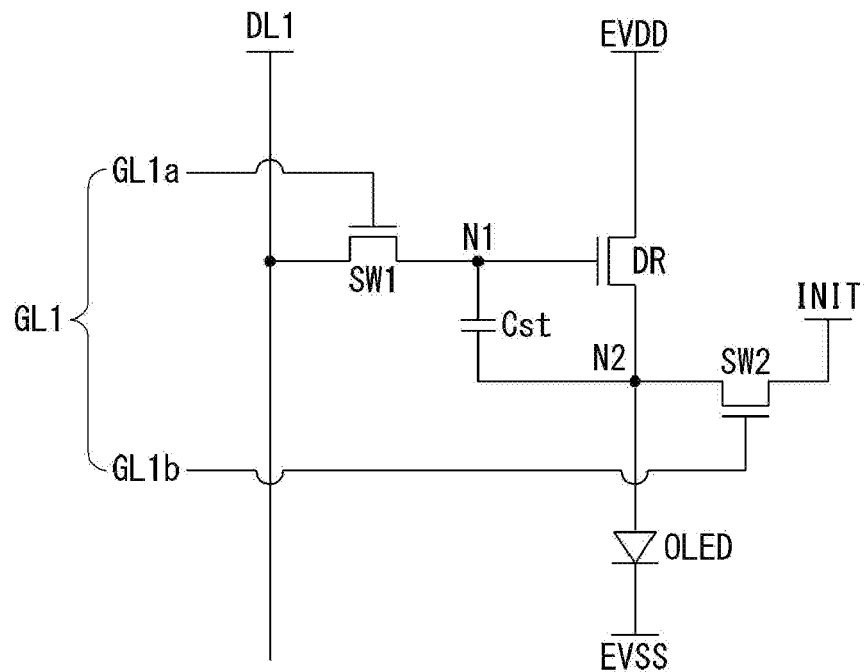
Figure 4:
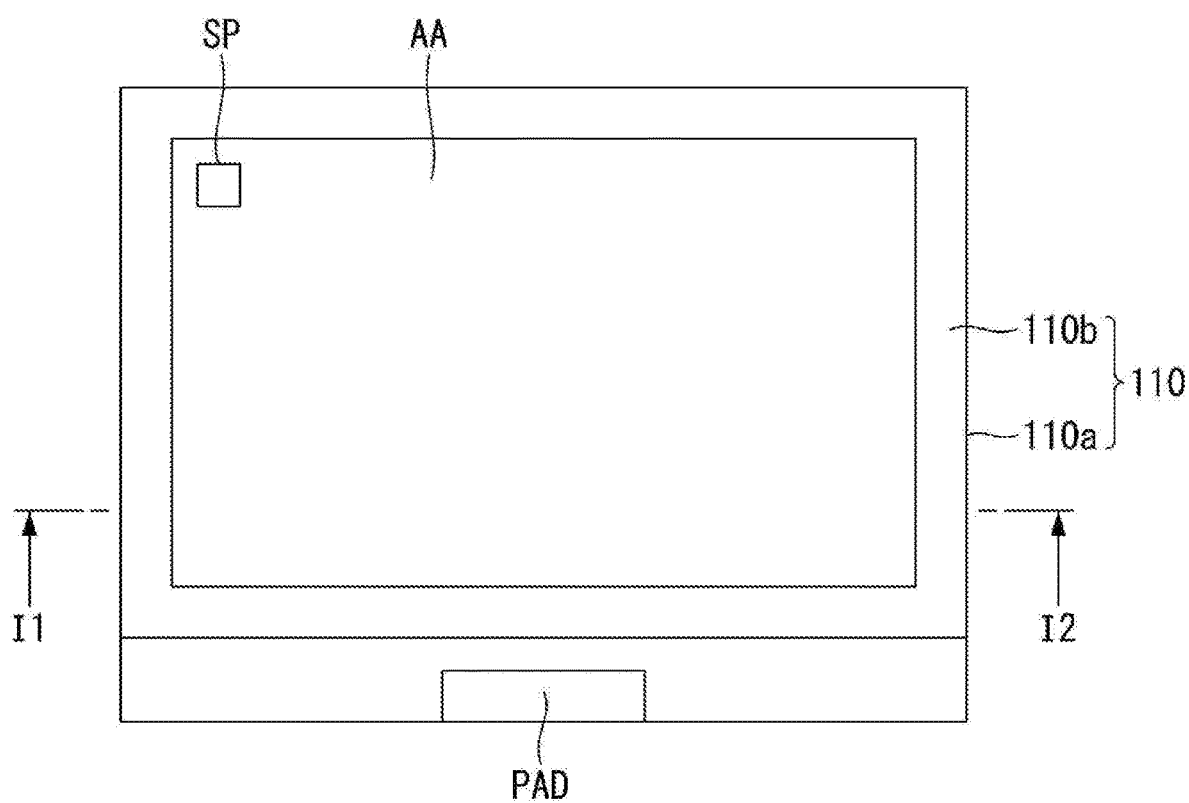
FIG. 4 illustrates an example of the plane of a display panel.
Figure 5A:
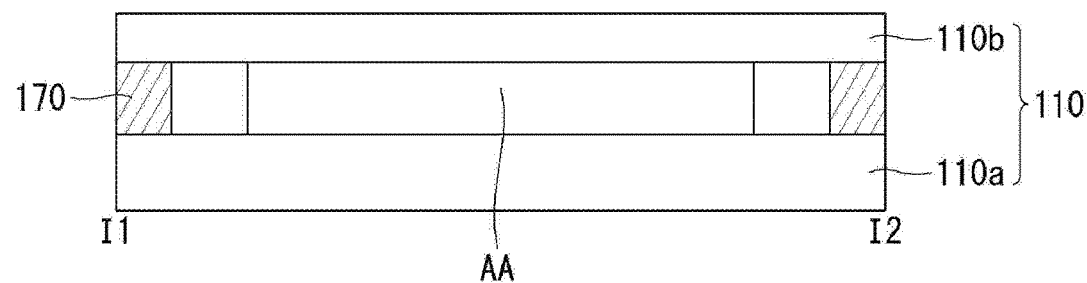
FIGS. 5A and 5B illustrate examples of a cross-section taken along the line 11-12 of FIG. 4.
Figure 5B:
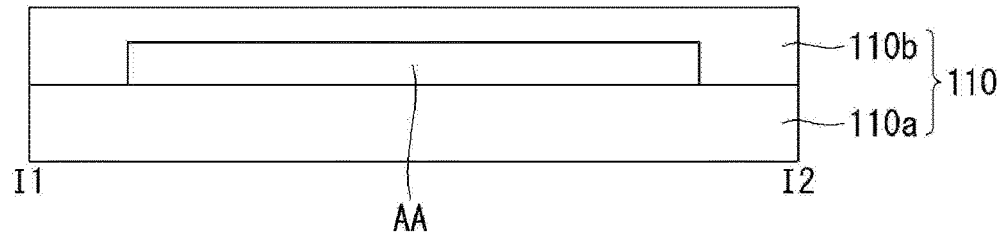

FIG. 1 is a schematic block diagram of an organic light-emitting display. FIG. 2 is a schematic circuit diagram of a subpixel. FIGS. 3A and 3B illustrates examples of a detailed circuit configuration of a portion of FIG. 2. FIG. 4 illustrates an example of the plane of a display panel. FIGS. 5A and 5B illustrate examples of a cross-section taken along the line 11-12 of FIG. 4.

As shown in the FIG. 1 example, the organic light-emitting display may include a timing controller 180, a data driver 130, a scan driver 140, a display panel 110, and a power supply part 160. The timing controller 180 may receive drive signals, including a data enable signal, a vertical synchronization signal, a horizontal synchronization signal, and a clock signal, along with data signals DATA, from an image processor (not shown). Based on the drive signals, the timing controller 180 may output a gate timing control signal GDC for controlling the operation timing of the scan driver 140 and a data timing control signal DDC for controlling the operation timing of the data driver 130. The timing controller 180 may be provided in the form of an integrated circuit (IC).

The data driver 130 may sample and latch a data signal DATA supplied from the timing controller 180 in response to a data timing control signal DDC supplied from the timing controller 180, and may convert a digital data signal to an analog data signal (or data voltage) as a gamma reference voltage and may output the converted digital data signal. The data driver 130 may output data signals DATA through data lines DL1 to DLn. The data driver 130 may be provided in the form of an IC.

The scan driver 140 may output scan signals in response to a gate timing control signal GDC supplied from the timing controller 180. The scan driver 140 may output scan signals through scan lines (or gate lines) GL1 to GLm. The scan driver 140 may be provided in the form of an IC or may be formed on the display panel 110 using gate-in-panel technology in which transistors are formed using a thin-film process.

The power supply part 160 may output a high-level voltage and a low-level voltage. The high-level voltage and low-level voltage outputted from the power supply part 160 may be supplied to the display panel 110. The high-level voltage may be supplied to the display panel 110 via a first power line EVDD, and the low-level voltage may be supplied to the display panel 110 via a second power line EVSS. The power supply part 160 may be provided in the form of an IC.

The display panel 110 may display an image in response to data signals DATA supplied from the data driver 130, scan signals supplied from the scan driver 140, and electric power supplied from the power supply part 160. The display panel 110 may include subpixels SP that work to display an image and emit light.

The subpixels SP may include red subpixels, green subpixels, and blue subpixels, or may include white subpixels, red subpixels, green subpixels, and blue subpixels. Embodiments are not limited to these examples. The subpixels SP may have one or more different light-emission areas depending on the light-emission characteristics.

As shown in the FIG. 2 example, a single subpixel may be positioned at the intersection of a data line DL1 and a scan line GL1, and may include a programming part SC for setting the gate-source voltage of a driving transistor DR and an organic light-emitting diode OLED. The organic light-emitting diode OLED may include an anode ANO, a cathode CAT, and an organic emissive layer sandwiched between the anode ANO and the cathode CAT. The anode ANO may be connected to the driving transistor DR.

The programming part SC may include a transistor part (e.g., a transistor array) including at least one switching transistor and at least one capacitor. The transistor part may be implemented based on a complementary metal-oxide-semiconductor (CMOS) semiconductor, a p-type metal-oxide-semiconductor (PMOS) semiconductor, or an n-type metal-oxide-semiconductor (NMOS) semiconductor. The transistors in the transistor part may be implemented as p-type or n-type. Moreover, semiconductor layers of the transistors included in the transistor part of the subpixel may contain amorphous silicon, polysilicon, or oxide. Embodiments are not limited to these examples.

The switching transistor may turn on in response to a scan signal from the scan line GL1 to apply a data voltage from the data line DL1 to one electrode of the capacitor. The driving transistor DT may adjust the amount of light emitted from the organic light-emitting diode OLED by controlling the amount of current depending on the amount of voltage stored in the capacitor. The amount of light emitted from the organic light-emitting diode OLED is proportional to the amount of current supplied from the driving transistor DT. Also, the subpixel may be connected to a first power supply line EVDD and a second power supply line EVSS to receive high-level voltage and low-level voltage.

As shown in the FIG. 3A example, the subpixel may include an internal compensation circuit CC, as well as the aforementioned switching transistor SW, driving transistor DR, capacitor Cst, and organic light-emitting diode OLED. The internal compensation circuit CC may include one or more transistors connected to a compensation signal line INIT. The internal compensation circuit CC may set the gate-source voltage of the driving transistor DR to a voltage that reflects variation in threshold voltage to reduce or cancel out any brightness variation caused by the threshold voltage of the driving transistor DR when the organic light-emitting diode OLED emits light. For example, the scan line GL1 may include at least two scan lines GL1a and GL1b for controlling the switching transistor SW and the transistors in the internal compensation circuit CC.

As shown in the FIG. 3B example, the subpixel may include a switching transistor SW1, a driving transistor DR, a sensing transistor SW2, a capacitor Cst, and an organic light-emitting diode OLED. The sensing transistor SW2 is a transistor that may be included in the internal compensation circuit CC, and may perform a sensing operation for compensating for the subpixel.

The switching transistor SW1 may supply a data voltage, supplied through the data line DL1 to a first node N1, in response to a scan signal supplied through the first scan line GL1a. The sensing transistor SW2 may reset or sense a second node N2, situated between the driving transistor DR and the organic light-emitting diode OLED, in response to a sensing signal supplied through the second scan line GL1b.

Meanwhile, the above circuit configuration of the subpixel depicted in the examples of FIGS. 3A and 3B is illustrated for ease of comprehension. That is, the circuit configuration of the subpixel according to an embodiment of the present disclosure is not limited to the above example, but may vary, including, e.g., 2T (transistor) 1C (capacitor), 3T2C, 4T2C, 5T1C, 6T2C, and 7T2C configurations.

As shown in the FIG. 4 example, the display panel 110 may include a first substrate 110a, a second substrate 110b, a display area AA, and a pad part PAD. The display area AA may include subpixels SP that may emit light. While the subpixels SP in the display area AA may be sealed because of their sensitivity to moisture or oxygen, the pad part PAD may be exposed because it may include pads for facilitating an electrical connection with an external substrate.

The display area AA may occupy most of the surface of the first substrate 110a, and the pad part PAD may be on one outer edge of the first substrate 110a. The display panel 110 may be rectangular, but embodiments are not limited thereto. For example, the display panel 110 may have various shapes, such as a pentagon, hexagon, polygon, circle, or oval. An oval shape may include an elliptical shape, an egg-shape, a rectangular shape with rounded corners, or other non-circular curved shape having a width different from its height.

As shown in the examples of FIG. 4 and FIG. 5A, the display area AA may be sealed with a sealing member 170 between the first substrate 110a and second substrate 110b. As shown in the examples of FIG. 4 and FIG. 5B, the display area AA may be sealed with the first substrate 110a and second substrate 110b alone.

The display panel 110 may be provided in various shapes, including flat, flexible or stretchable, or curved. Moreover, the display panel 110 may be implemented as a bottom-emission type that may emit light toward the first substrate 110a, a top-emission type that may emit light toward the second substrate 110b, or a dual-emission type that may emit light toward both of the substrates 110a and 110b. Therefore, the sealing structure of the display panel 110 may be selected to conform to a desired shape, and is therefore not limited to what is depicted in FIGS. 4 and 5. Below, the top-emission type will be described as an example of the large-area display panel 110.

Test Example

Figure 6:
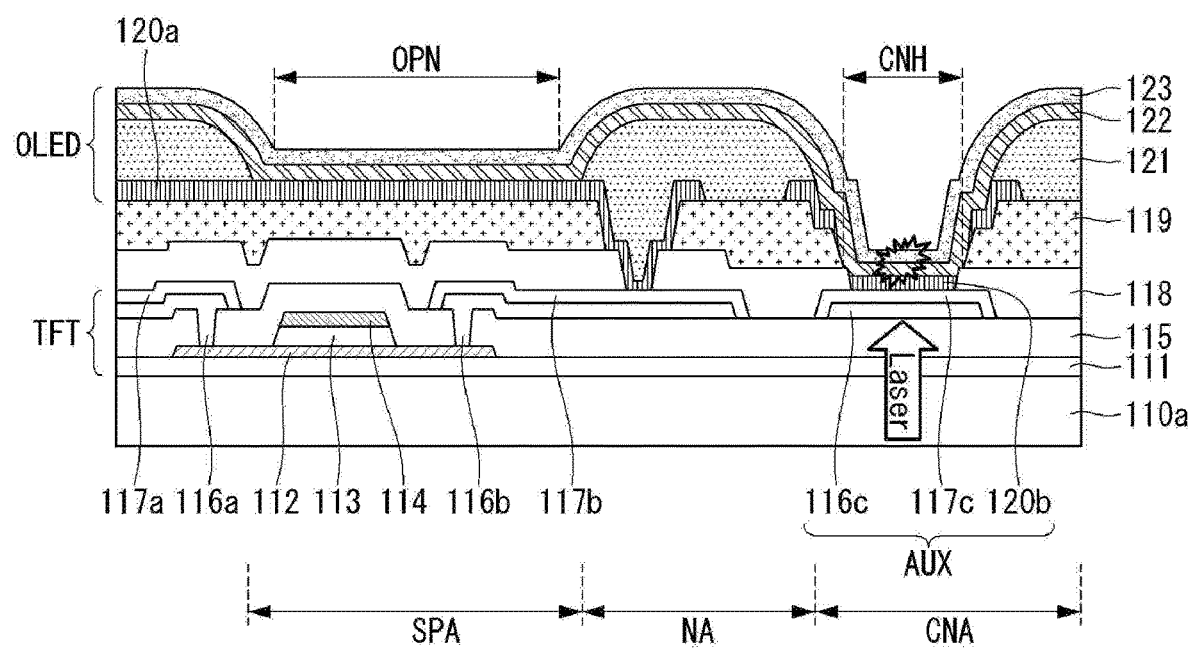
FIG. 6 is a cross-sectional view of a portion of the display panel according to a test example embodiment of the present disclosure.

FIG. 6 is a cross-sectional view of a portion of the display panel according to a test example embodiment of the present disclosure.

As shown in the example of FIG. 6, the display panel according to the test example may include a first substrate 110a, a transistor TFT, an organic light-emitting diode OLED, and a second substrate 110b. The transistor TFT and the organic light-emitting diode OLED may be included in a light-emitting area SPA of a subpixel.

A non-light-emitting area NA may be adjacent to the light-emitting area SPA of the subpixel. A contact area CNA may be adjacent to the non-light-emitting area NA. In areas other than the light-emitting area SPA of the subpixel, light emission may not actually occur. Thus, the contact area CNA may also be included in the non-light-emitting area NA. However, it should be noted that the contact area CNA may be provided to connect a common electrode layer 123 of the organic light-emitting diode OLED to an auxiliary line AUX, and may therefore be defined as a separate area because of its functional differences from the non-light-emitting area NA. The components included in the display panel according to the test example will be discussed in further detail with regard to in the example embodiments below, so detailed descriptions thereof will be omitted.

In the test example, the auxiliary line AUX may improve brightness uniformity on a large-area, top-emission display panel. The auxiliary line AUX may include multiple layers to help reduce the resistance of the common electrode layer 123. The auxiliary line AUX may include a first auxiliary electrode layer portion 116c, which may be one of metal layer portions 116a, 116b, and 116c, a second auxiliary electrode layer portion 117c, which may be one of cover layer portions 117a, 117b, and 117c, and a third auxiliary electrode layer portion 120b, which may be one of pixel electrode layers 120, 120a, and 120b. The third auxiliary electrode layer portion 120b at the uppermost part of the auxiliary line AUX may be electrically connected to the common electrode layer 123.

In the test example, an organic emissive layer 122 is situated between the common electrode layer 123 and the third auxiliary electrode layer portion 120b at the uppermost part of the auxiliary line AUX, due to the characteristics of the manufacturing process. Thus, the structure of the test example uses laser irradiation to bring the common electrode layer 123 and the third auxiliary electrode layer portion 120b at the uppermost part of the auxiliary line AUX into electrical contact with each other. In the example embodiment of the present disclosure described below, the auxiliary line AUX provided on the large-area, top-emission display panel to help reduce the resistance of the common electrode layer 123 may allow for contact between electrodes without any laser irradiation process.

First Example Embodiment

Figure 7:
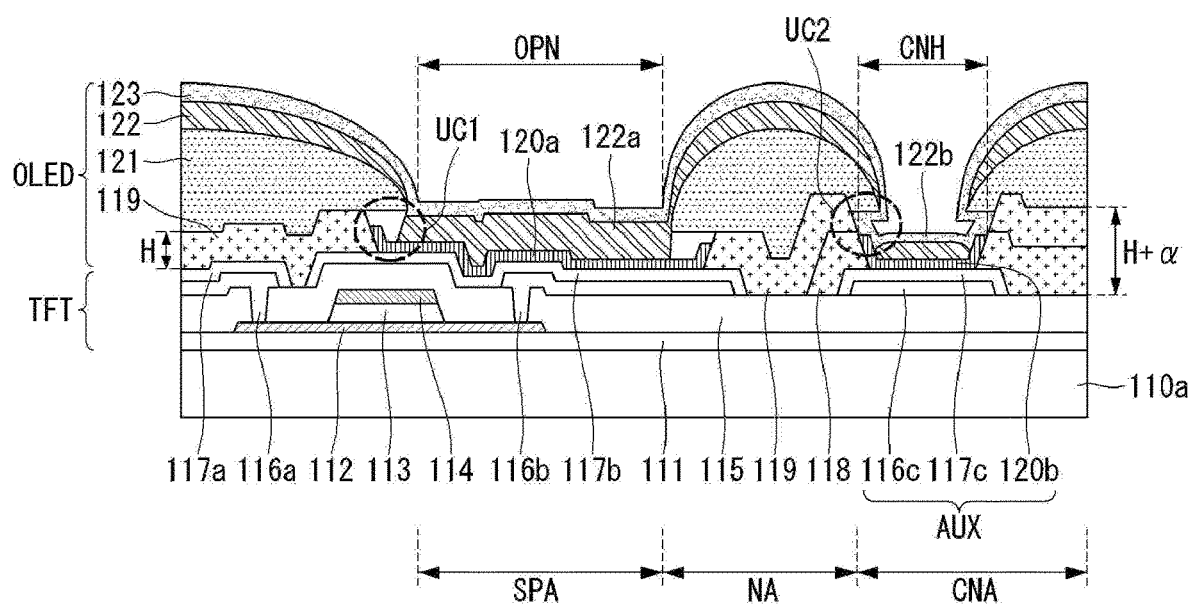
FIG. 7 is a cross-sectional view of a portion of the display panel according to a first example embodiment of the present disclosure.

FIG. 7 is a cross-sectional view of a portion of the display panel according to a first example embodiment of the present disclosure.

As shown in the FIG. 7 example, the display panel according to the first example embodiment may include a first substrate 110a, a transistor TFT, an organic light-emitting diode OLED, and a second substrate 110b. The transistor TFT and the organic light-emitting diode OLED may be included in a light-emitting area SPA of a subpixel.

A non-light-emitting area NA may be adjacent to the light-emitting area SPA of the subpixel. A contact area CNA may be adjacent to the non-light-emitting area NA. In areas other than the light-emitting area SPA of the subpixel, light emission may not actually occur. Thus, the contact area CNA may also be included in the non-light-emitting area NA. However, it should be noted that the contact area CNA may be provided to connect a common electrode layer 123 of the organic light-emitting diode OLED to an auxiliary line AUX, and may therefore be defined as a separate area because of its functional differences from the non-light-emitting area NA.

The structures formed between the two substrates 110a and 110b will be described below. However, it should be noted that the cross-sectional structure seen in the light-emitting area SPA of the subpixel may correspond to a portion of a single subpixel. In the following description, as long as these structures are formed on the front side of the substrates, the structures between the two substrates 110a and 110b may be located in the light-emitting area SPA of the subpixel or in the contact area CNA.

A buffer layer 111 may be on the first substrate 110a. A semiconductor layer 112 may be on the buffer layer 111. The semiconductor layer 112 may be in the display area AA, and may have a source region, a channel region, and a drain region. A gate insulating layer 113 may be on the semiconductor layer 112. The gate insulating layer 113 may cover the channel region of the semiconductor layer 112 in the display area AA.

A gate metal layer 114 may be on the gate insulating layer 113. The gate metal layer 114 may correspond to the size of the gate insulating layer 113. The gate metal layer 114 may be a gate electrode of the transistor TFT. In addition, the gate metal layer 114 may form a scan line or the like. An interlayer insulating layer 115 may be on the gate metal layer 114. The interlayer insulating layer 115 may expose the source and drain regions of the semiconductor layer 112.

Metal layer portions 116a, 116b, and 116c may be on the interlayer insulating layer 115. The metal layer portions 116a, 116b, and 116c may be on the same level or layer. The metal layer portions 116a, 116b, and 116c may be divided into metal layer portions 116a and 116b located in the light-emitting area SPA of the subpixel, and a metal layer portion 116c located in the contact area CNA. The metal layer portions 116a and 116b in the light-emitting area SPA of the subpixel may be separated to be connected to the source and drain regions of the semiconductor layer 112. The first and second metal layer portions 116a and 116b may be source and drain electrodes of the transistor TFT. The third metal layer portion 116c located in the contact area CNA may be defined as the first auxiliary electrode layer portion 116c of the auxiliary line AUX. The metal layer portions 116a, 116b, and 116c may form a data line and the source and drain electrodes of the transistor TFT, and may be defined as data metal layers.

Cover layer portions 117a, 117b, and 117c may be on the metal layer portions 116a, 116b, and 116c. The cover layer portions 117a, 117b, and 117c may be on the same level or layer. The cover layer portions 117a, 117b, and 117c may be divided into cover layer portions 117a and 117b located in the light-emitting area SPA of the subpixel, and a cover layer portion 117c located in the contact area CNA. The first to third cover layer portions 117a, 117b, and 117c may be patterned to cover the metal layer portions 116a, 116b, and 116c, respectively. The third cover layer portion 117c may be defined as the second auxiliary electrode layer portion 117c of the auxiliary line AUX.

In the contact area CNA, a first passivation layer 118 may expose the third cover layer portion 117c (or part of the third metal layer portion 117c if the third cover layer is not present). In the non-light-emitting area NA, aside from the light-emitting area SPA of the subpixel, a second passivation layer 119 may expose the second cover layer portion 117b (or part of the second metal layer portion 117b if the second cover layer is not present). The first passivation layer 118 and the second passivation layer 119 may protect the underlying structure layer including the transistor TFT. In the contact area CNA, the first passivation layer 118 and the second passivation layer 119 may be deposited on top of each other to form a thick passivation layer, whereas, in the non-light-emitting area NA, only the first passivation layer 118 may be deposited to thereby form a relatively thin passivation layer. The benefits of varying the thickness of the passivation layer for each area will be discussed in detail below.

An organic insulating layer 121 may be on the second passivation layer 119 in the non-light-emitting area NA and contact area CNA. The organic insulating layer 121 may have an opening OPN defining the light-emitting area SPA of the subpixel and a contact hole CNH defining the contact area CNA. The pixel electrode layer portions 120a and 120b may be partially exposed through the opening OPN and contact hole CNH formed in the organic insulating layer 121, respectively. The organic insulating layer 121 may have an opening OPN defining the light-emitting area SPA of the subpixel. The opening OPN may have a first undercut shape UC1, which may be formed by recessing the second passivation layer 119 into the bottom of the organic insulating layer 121 to partially expose the bottom of the organic insulating layer 121. Due to the first undercut shape UC1, the top of the second passivation layer 119 may be narrower in width than the bottom of the organic insulating layer 121. Although the top of the second passivation layer 119 may contact the bottom of the organic insulating layer 121, part of the bottom of the organic insulating layer 121 may be exposed without contacting the top of the second passivation layer 119.

The organic insulating layer 121 may have a contact hole CNH defining the contact area CNA. The contact hole CNH may have a second undercut shape UC2, which may be formed by recessing the first passivation layer 118 and the second passivation layer 119 into the bottom of the organic insulating layer 121 to partially expose the bottom of the organic insulating layer 121. Due to the second undercut shape UC2, the top of the first and second passivation layers 118 and 119 may be narrower in width than the bottom of the organic insulating layer 121. The width of the second passivation layer 119 may be greater than the width of the first passivation layer 118. Although the top of the second passivation layer 119 may contact the bottom of the organic insulating layer 121, part of the bottom of the organic insulating layer 121 may be exposed without contacting the top of the second passivation layer 119.

The first undercut shape UC1 and the second undercut shape UC2 may have a similar shape. However, the second passivation layer 119 may exist alone in an area around the opening OPN formed by the first undercut shape UC1, and both the first passivation layer 118 and the second passivation layer 119 may exist in an area around the contact area CNA formed by the second undercut shape UC2. The height H of the underlying space created by the first undercut shape UC1 and the height (H+α) of the underlying space created by the second undercut shape UC2 may represented by the relationship UC1<UC2.

The pixel electrode layer portions 120a and 120b may be on the second cover layer portion 117b and third cover layer portion 117c exposed through the organic emission layer 121. The first pixel electrode layer portion 120a on the second cover layer portion 117b in the light-emitting area SPA of the subpixel may be defined as the anode of the organic light-emitting diode OLED. The second pixel electrode layer portion 120b on the third cover layer portion 117c in the contact area CNA may be defined as a third auxiliary electrode layer portion 120b of the auxiliary line AUX. The first pixel electrode layer portion 120a may penetrate all the way into the underlying space created by the first undercut shape UC1, and may cover the sidewall of the second passivation layer 119. The second pixel electrode layer portion 120b may penetrate all the way into the underlying space created by the second undercut shape UC2, and may cover the sidewall of the first passivation layer 118 (and may also cover part of the second passivation layer 119).

The organic emissive layer 122 may be on the first pixel electrode layer portion 120a, second pixel electrode 120b, and organic insulating layer 121. The organic emissive layer 122 may include an organic emissive layer portion 122a and an organic emissive layer portion 122b. The organic emissive layer 122 may include a material that may emit red, green, or blue light, or a material that may emit white light if a color filter is present. Embodiments are not limited to these examples. The organic emissive layer portion 122a on the first pixel electrode layer portion 120a may be formed along with the organic emissive layer 122 on the organic insulating layer 121, but may be separated from it due to the first undercut shape UC1. Likewise, the organic emissive layer portion 122b on the second pixel electrode layer portion 120b may be formed along with the organic emissive layer 122 on the organic emissive layer 121, but may be separated from it due to the second undercut shape UC2. The organic emissive layer portion 122a on the first pixel electrode layer portion 120a may exist only in the opening OPN due to the first undercut shape UC1, it may occupy less area than the underlying first pixel electrode layer portion 120a. The organic emissive layer portion 122b on the second pixel electrode layer portion 120b may exist only in the contact hole CNH due to the second undercut shape UC2, it may occupy less area than the underlying second pixel electrode layer portion 120b. The organic emissive layer portion 122b existing in the contact hole CNH may not emit light. That is, no light may be emitted in the contact area CNA.

Due to the first undercut shape UC1, the organic emissive layer 122 on the organic insulating layer 121 and the organic emissive layer portion 122a on the first pixel electrode layer portion 120a may be separated from each other. Also, the organic insulating layer 121 may have no pixel electrode layer portions 120a and 120b left on it, and this may avoid or prevent a short circuit that may occur when the pixel electrode layer portions 120a and 120b and the common electrode layer 123 come into contact with each other, even if the organic emissive layer portion 122a is not thin. The organic emissive layer portion 122a on the first pixel electrode layer portion 120a may emit light, whereas the organic emissive layer portion 122b on the second pixel electrode layer portion 120b may not emit light. As a result, the first example embodiment may have an advantage in reducing or preventing lateral current leakage, which may occur between neighboring subpixels.

The common electrode layer 123 may be on the organic emissive layer 122. The common electrode layer 123 may be defined as the cathode of the organic light-emitting diode OLED. The common electrode layer 123 may be formed to fully cover the organic emissive layer 122 exposed in the display area of the display panel, e.g., to cover all subpixels. As such, the common electrode layer 123 may extend seamlessly in the non-light-emitting area NA and the contact area CNA, as well as across the opening OPN defining the light-emitting area SPA of the subpixel.

Notably, in the common electrode layer 123, the underlying space created by the second undercut shape UC2 may be taller than the underlying space created by the first second shape UC1, due to the thickness of the first passivation layer 118 and second passivation layer 119 that lie under the second undercut shape UC2. Therefore, the common electrode layer 123 in the contact area CNA may cover the second pixel electrode layer portion 120b exposed through the contact hole CNH and the organic emissive layer portion 122b on the second pixel electrode layer portion 120b, as well as the sidewalls of the first passivation layer 118 and second passivation layer 119. As a result, the common electrode layer 123 in the contact area CNA may be electrically connected to the second pixel electrode layer portion 120b at the uppermost part of the auxiliary line AUX, without an additional process, such as laser irradiation.

Thus, in the first example embodiment of the present disclosure, the organic emissive layer 122 can be short-circuited simply by increasing the thickness of the passivation layers 118 and 119 in the contact area CNA, and at the same time the auxiliary line AUX and the common electrode layer 123 may be brought into contact with each other. Due to this, when the common electrode layer 123 is formed, it may come into electrical contact with the second pixel electrode layer portion 120b at the uppermost part of the auxiliary line AUX. Therefore, the first example embodiment of the present disclosure illustrated in the FIG. 7 example can simplify the process as compared to the test example illustrated in the FIG. 6 example. According to the first example embodiment of the present disclosure, the common electrode layer 123 and the second pixel electrode layer portion 120b at the uppermost part of the auxiliary line AUX may come into contact with each other on the sidewall of the second passivation layer 119 exposed in the contact area CNA. According to the first example embodiment of the present disclosure, the common electrode layer 123 may cover all the layers exposed in the contact area CNA.

Hereinafter, a manufacturing method of the display panel according to the first example embodiment of the present disclosure will be described below.

FIGS. 8 to 15 illustrate a manufacturing method of the display panel according to the first example embodiment of the present disclosure.

Figure 8:
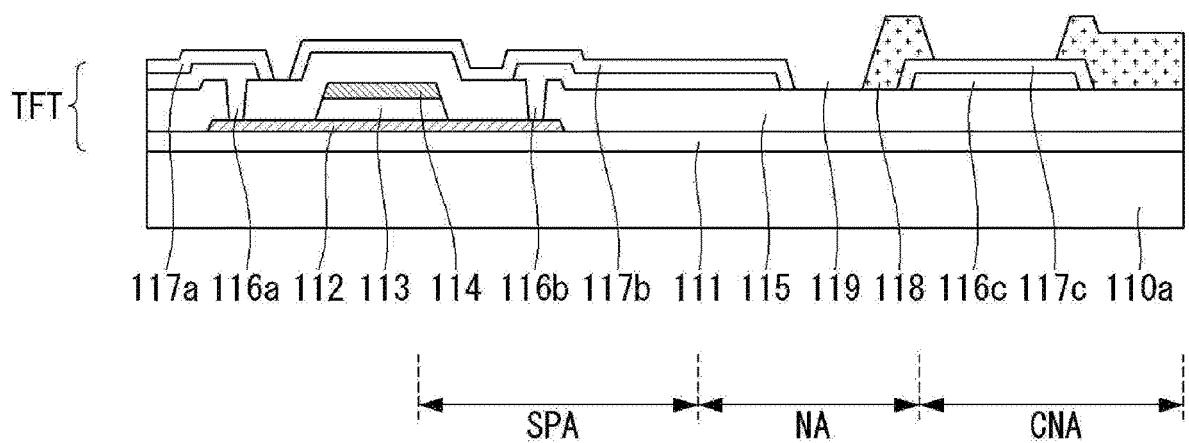
FIGS. 8 to 15 illustrate a manufacturing method of the display panel according to the first example embodiment of the present disclosure.

As shown in the FIG. 8 example, a buffer layer 111 may be formed on the first substrate 110a. The buffer layer 111 may be composed of a single layer of silicon nitride ($SiN_x$) or silicon oxide ($SiO_x$), or may be multiple layers of silicon nitride ($SiN_x$) and silicon oxide ($SiO_x$). The first substrate 110a may include, e.g., a silicon-based material, although embodiments are not limited thereto.

A semiconductor layer 112 may be formed on the buffer layer 111. The semiconductor layer 112 may be located in the display area AA, and may have a source region, a channel region, and a drain region. The semiconductor layer 112 may be made of, e.g., an organic semiconductor material, an oxide semiconductor material, or a silicon semiconductor material.

A gate insulating layer 113 may be formed on the semiconductor layer 112. The gate insulating layer 113 may cover the channel region of the semiconductor layer 112 existing in the display area AA. The gate insulating layer 113 may be composed of a single layer of silicon nitride ($SiN_x$) or silicon oxide ($SiO_x$), or may be multiple layers of silicon nitride ($SiN_x$) and silicon oxide ($SiO_x$).

A gate metal layer 114 may be formed on the gate insulating layer 113. The gate metal layer 114 may correspond to the size of the gate insulating layer 113. The gate metal layer 114 may be a gate electrode of the transistor TFT. In addition, the gate metal layer 114 may form a scan line or the like. The gate insulating layer 113 may include one or more of: molybdenum (Mo), aluminum (Al), chromium (Cr), gold (Au), titanium (Ti), nickel (Ni), and copper (Cu), or an alloy thereof, and may be composed of a single layer or multiple layers. Embodiments are not limited to these examples.

An interlayer insulating layer 115 may be formed on the gate metal layer 114. The interlayer insulating layer 115 may be composed of a single layer of silicon nitride ($SiN_x$) or silicon oxide ($SiO_x$), or may be multiple layers of silicon nitride ($SiN_x$) and silicon oxide ($SiO_x$). The interlayer insulating layer 115 may expose the source and drain regions of the semiconductor layer 112.

The metal layer portions 116a, 116b, and 116c may be formed on the interlayer insulating layer 115. The metal layer portions 116a, 116b, and 116c may include first and second metal layer portions 116a and 116b connected separately to the source and drain regions of the semiconductor layer 112 in the light-emitting area SPA of the subpixel, and a third metal layer portion 116c separately located in the contact area CNA. The first and second metal layer portions 116a and 116b may be the source and drain regions of the transistor TFT, and the third metal layer portion 116c may be the first auxiliary electrode layer portion 116c of the auxiliary line AUX. The metal layer portions 116a, 116b, and 116c may include one or more of: molybdenum (Mo), aluminum (Al), chromium (Cr), gold (Au), titanium (Ti), nickel (Ni), and copper (Cu), or an alloy thereof, and may be composed of a single layer or multiple layers. Embodiments are not limited to these examples.

The cover layer portions 117a, 117b, and 117c may be formed on the metal layer portions 116a, 116b, and 116c. The cover layer portions 117a, 117b, and 117c may be patterned, corresponding to the positions of the metal layer portions 116a, 116b, and 116c, to cover and protect the metal layer portions 116a, 116b, and 116c separated for the light-emitting area SPA of the subpixel and the contact area CNA. Unlike the first and third cover layer portions 117a and 117c, the second cover layer portion 117b may be patterned to also cover the channel region. The third cover layer portion 117c may be the second auxiliary electrode layer portion 117c of the auxiliary line. The cover layer portions 117a, 117b, and 117c may include oxides such as indium tin oxide (ITO) and indium zinc oxide (IZO). The cover layer portions 117a, 117b, and 117c may be omitted due to the characteristics of the process. A first passivation layer 118 may be formed on the interlayer insulating layer 115 and the cover layer portions 117a, 117b, and 117c. The first passivation layer may be is patterned so that part of it may be located in the contact area CNA and the non-light-emitting area NA. The first passivation layer 118 may expose the third cover layer portion 117c located in the contact area CNA. The first passivation layer 118 may be composed of a single layer of silicon nitride (SiN) or silicon oxide ($SiO_x$), or may be multiple layers of silicon nitride (SiN) and silicon oxide ($SiO_x$).

Figure 9:
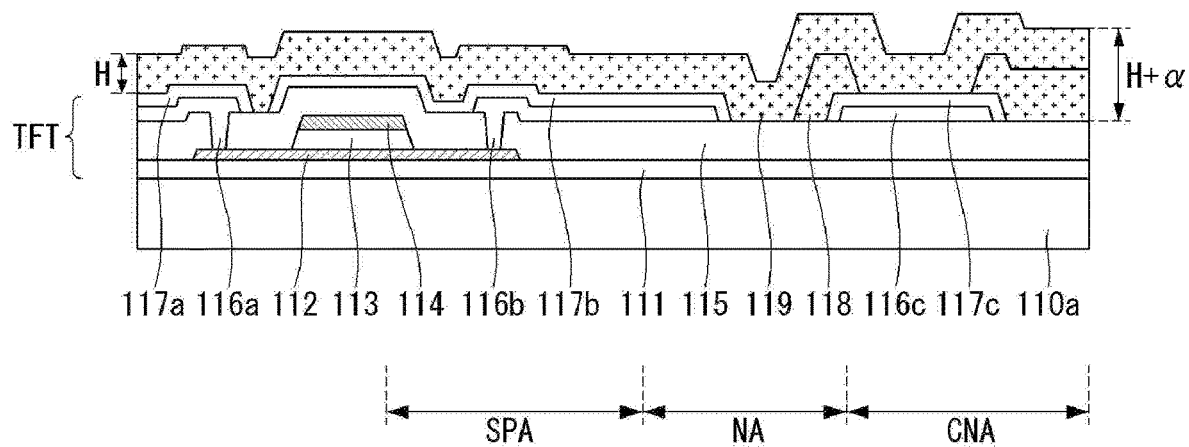

As shown in the FIG. 9 example, a second passivation layer 119 may be formed on the interlayer insulating layer 115, the cover layer portions 117a, 117b, and 117c, and the first passivation layer 118. The second passivation layer 119 may exist alone in the non-light-emitting area NA adjacent to the light-emitting area SPA of the subpixel, and both the first passivation layer 118 and the second passivation layer 119 may be adjacent to the contact area CNA. As a result, the height H of the second passivation layer 119 adjacent to the light-emitting area SPA of the subpixel may be greater than the height (H+a) of the first and second passivation layers 118 and 119 adjacent to the contact area CNA. The second passivation layer 119 may include a material either the same as or different from that of the first passivation layer 118. The thickness of the second passivation layer 119 may be different than the thickness of the first passivation layer 118. The thickness (e.g., greater than or equal to 1,000 Å) may be greater than the thickness (e.g., less than or equal to 1,000 Å) of the second passivation layer 119. The thicker the first passivation layer 118 is than the second passivation layer 119, the better. The related benefits will be discussed below.

Figure 10:
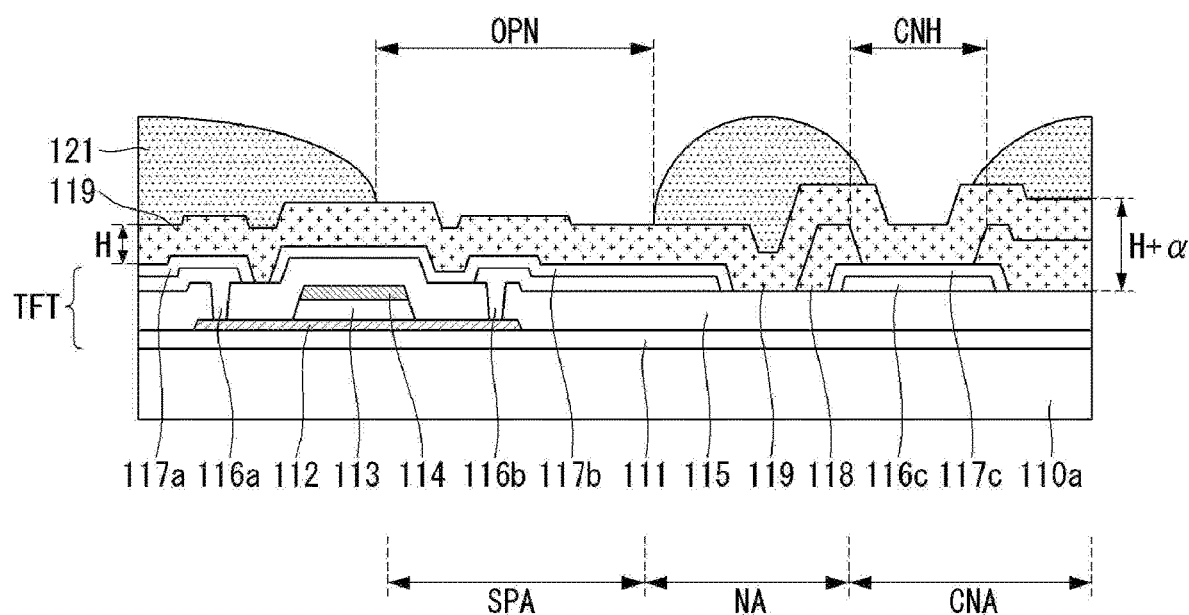

As shown in the FIG. 10 example, an organic insulating layer 121 may be formed on the second passivation layer 119. The organic insulating layer 121 may be made of an organic material, such as a negative overcoat layer, polyimide, benzocyclobutene series resin, acrylate, and/or photoacrylate, although embodiments are not limited to these examples. The organic insulating layer 121 may be patterned to form an opening OPN in the light-emitting area SPA of the subpixel and a contact hole CNH in the contact area CNA.

Figure 11:
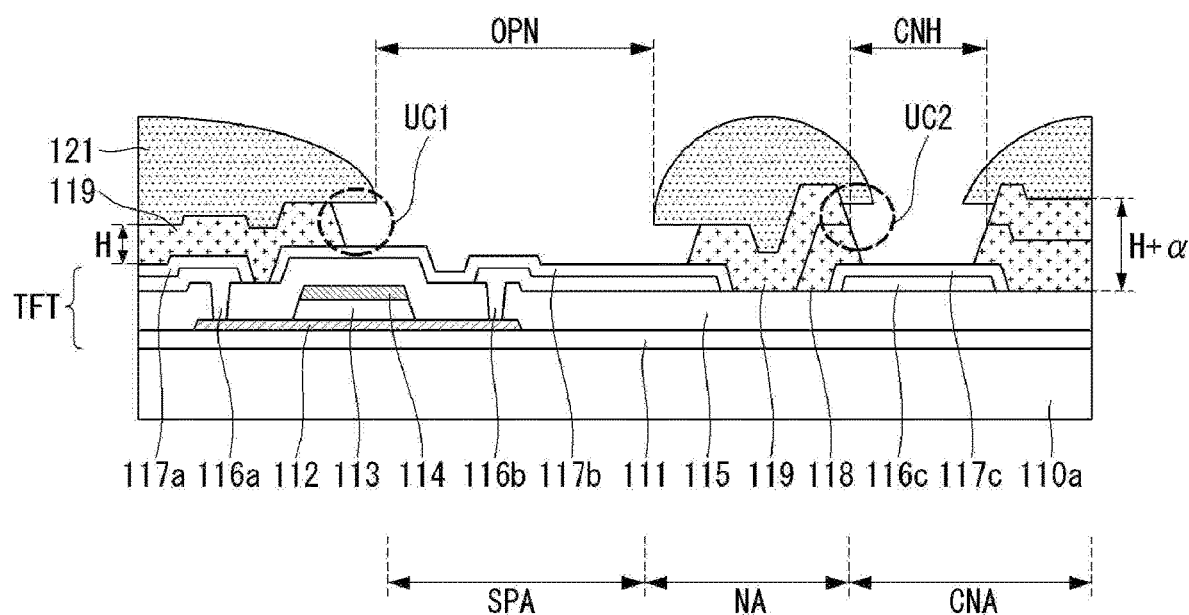

As shown in the FIG. 11 example, the first passivation layer 118 and second passivation layer 119 exposed out of the organic insulating layer 121 may be etched by using the organic insulating layer 121 as a mask. The first passivation layer 118 and the second passivation layer 119 may be etched, e.g., by wet etching. A first undercut shape UC1 may be formed in the opening OPN defining the light-emitting area SPA of the subpixel so that the underlying second passivation layer 119 may be recessed into the organic insulating layer 121. A second undercut shape UC2 may be formed in the contact hole CNH defining the contact area CNA so that the underlying first and second passivation layers 118 and 119 may be recessed into the organic insulating layer 121.

Figure 12:
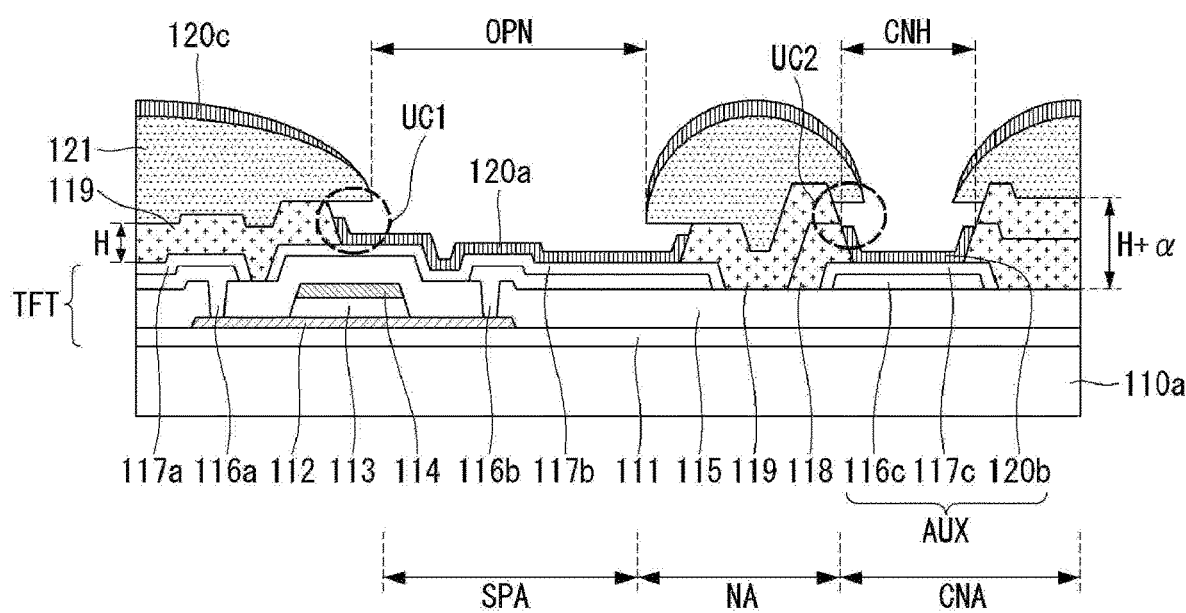

As shown in the FIG. 12 example, the pixel electrode layer portions 120a, 120b, and 120c may be formed by using the organic insulating layer 121 as a mask. The pixel electrode layer portions 120a, 120b, and 120c may be separated into different positions by the organic insulating layer 121. The pixel electrode layer portions 120a, 120b, and 120c may be automatically separated by the organic insulating layer 121, which can be referred to as "self-alignment." The first pixel electrode layer portion 120a on the second cover layer portion 117b in the light-emitting area SPA of the subpixel may be defined as the anode of the organic light-emitting diode OLED. The second pixel electrode layer portion 120b on the third cover layer portion 117c in the contact area CNA may be defined as the third auxiliary electrode layer portion 120b of the auxiliary line AUX.

Figure 13:
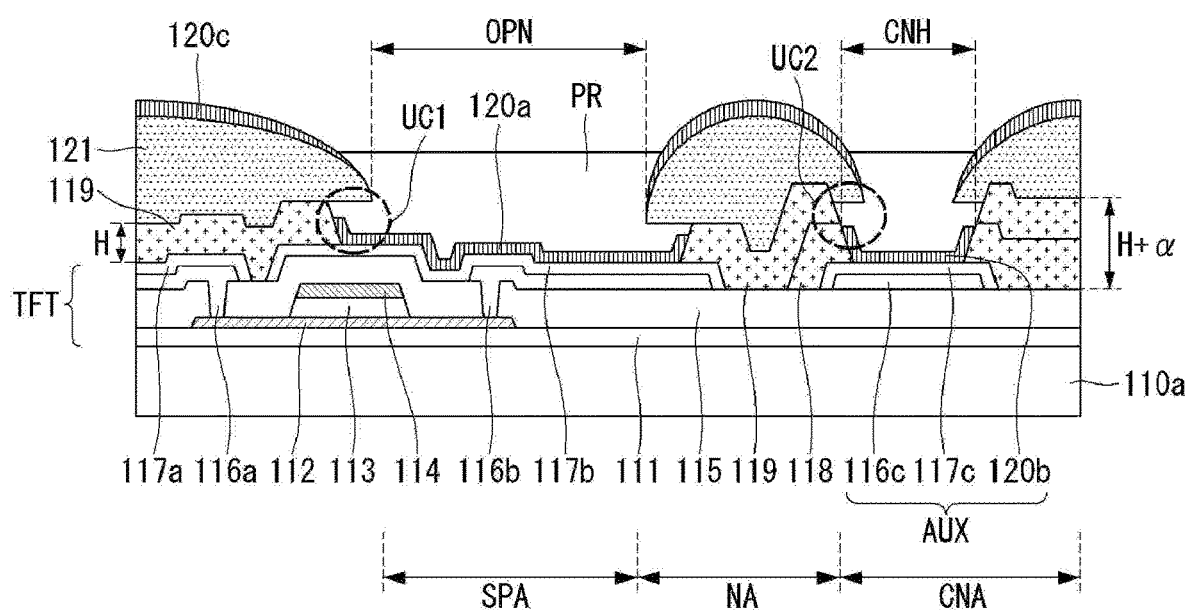
Figure 14:
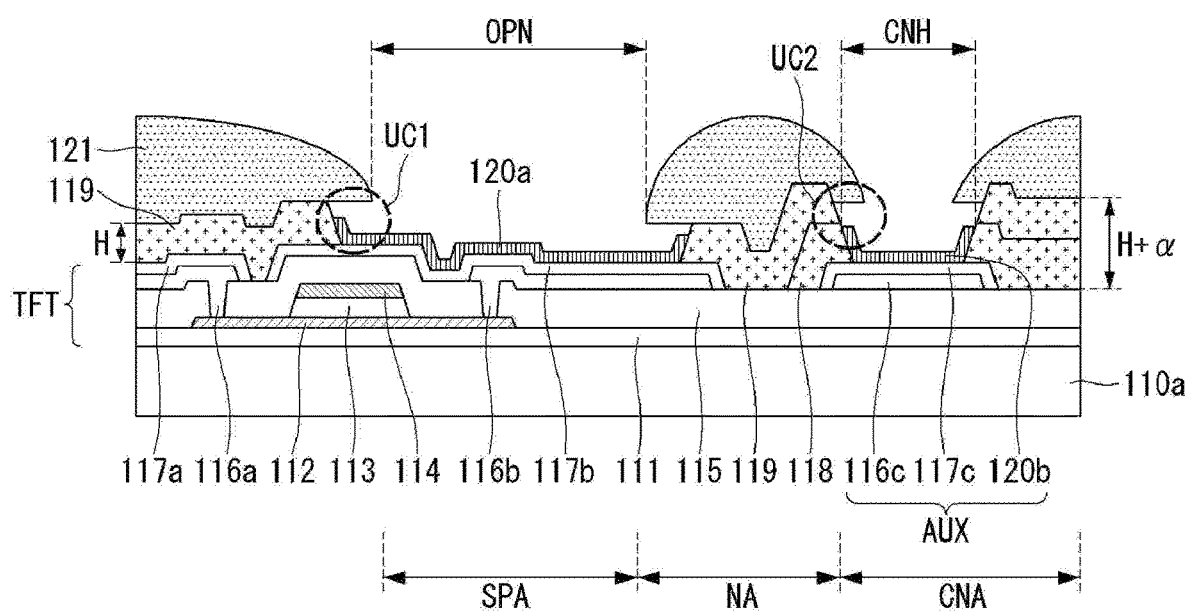

As shown in the examples of FIGS. 13 and 14, photoresist PR may be formed by using the organic insulating layer 121 as a mask. The photoresist PR may be formed to remove the third pixel electrode layer portion 120c left on the organic insulating layer 121. It may be preferable that the photoresist PR be formed almost as high as the bottom of the organic insulating layer 121. Accordingly, the photoresist PR may be ashed and then removed, and at the same time, the third pixel electrode layer portion 120c left on the organic insulating layer 121 may be removed.

Figure 15:
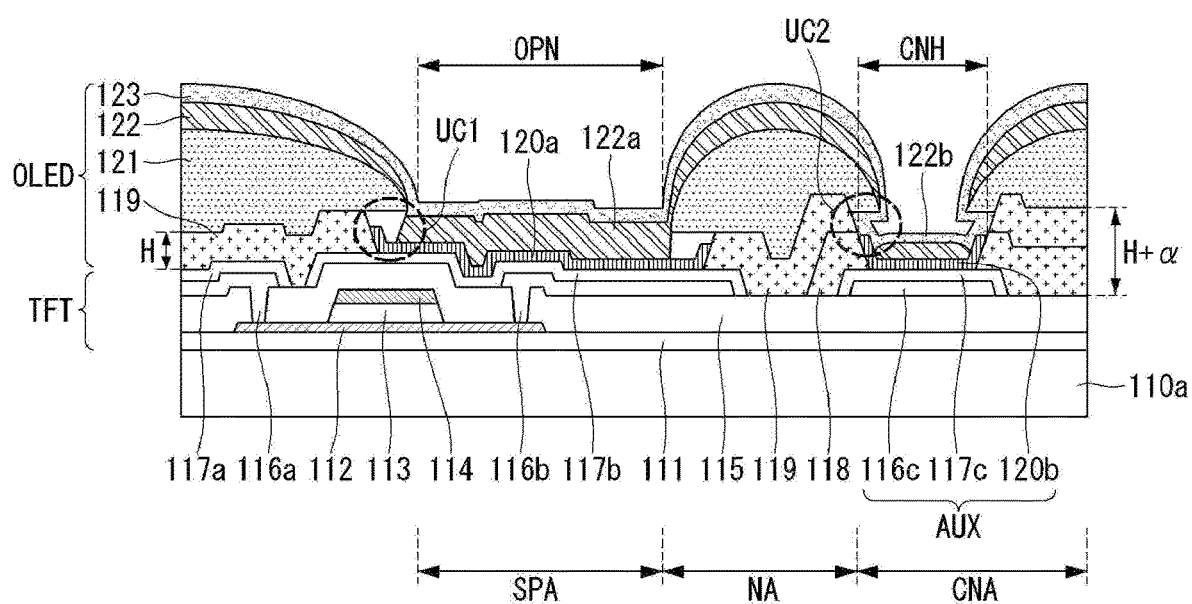

As shown in the FIG. 15 example, the organic emissive layer 122, including organic emissive layer portions 122a and 122b may be formed by using the organic insulating layer 121 as a mask. The organic emissive layer 122 may be include a material that may emit red, green, or blue light, or a material that may emit white light if a color filter is present. Embodiments are not limited to these examples. The organic emissive layer portion 122a on the first pixel electrode layer portion 120a may be formed along with the organic emissive layer 122 on the organic insulating layer 121, but may be separated from it due to the first undercut shape UC1. Likewise, the organic emissive layer portion 122b on the second pixel electrode layer portion 120b may be formed along with the organic emissive layer 122 on the organic emissive layer 121, but may be separated from it due to the second undercut shape UC2.

The organic emissive layer portion 122a on the first pixel electrode layer portion 120a may exist only in the opening OPN due to the first undercut shape UC1, and may occupy less area than the underlying first pixel electrode layer portion 120a. The organic emissive layer portion 122b on the second pixel electrode layer portion 120b may exist only in the contact hole CNH due to the second undercut shape UC2, and may occupy less area than the underlying second pixel electrode layer portion 120b. The organic emissive layer portion 122a on the first pixel electrode layer portion 120a may emit light, whereas the organic emissive layer portion 122b on the second pixel electrode layer portion 120b may not emit light. As a result, the first example embodiment may have an advantage in reducing or preventing lateral current leakage, which may occur between neighboring subpixels. Due to the first undercut shape UC1, the organic emissive layer 122 on the organic insulating layer 121 and the organic emissive layer portion 122a on the first pixel electrode layer portion 120a may be separated from each other. Also, the organic insulating layer 121 may have no pixel electrode layer portions 120a and 120b left on it, and this may avoid or prevent a short-circuit that may occur when the pixel electrode layer portions 120a and 120b and the common electrode layer 123 come into contact with each other, even if the organic emissive layer portion 122a is not thin.

The common electrode layer 123 may be on the organic emissive layer 122. The common electrode layer 123 may be defined as the cathode of the organic light-emitting diode OLED. The common electrode layer 123 may fully cover the organic emissive layer 122 exposed in the display area of the display panel, e.g., to cover all subpixels. As such, the common electrode layer 123 may extend seamlessly in the non-light-emitting area NA and the contact area CNA, as well as across the opening OPN defining the light-emitting area SPA of the subpixel.

Notably, in the common electrode layer 123, the underlying space created by the second undercut shape UC2 may be taller than the underlying space created by the first second shape UC1, due to the thickness of the first passivation layer 118 and second passivation layer 119 that lie under the second undercut shape UC2. Therefore, the common electrode layer 123 in the contact area CNA may cover the second pixel electrode layer portion 120b exposed through the contact hole CNH and the organic emissive layer portion 122b on the second pixel electrode layer portion 120b, as well as the sidewalls of the first passivation layer 118 and second passivation layer 119. As a result, the common electrode layer 123 in the contact area CNA may be electrically connected to the second pixel electrode layer portion 120b at the uppermost part of the auxiliary line AUX, without an additional process, such as laser irradiation. To facilitate this function, it may be preferable that the first passivation layer 118 exists only in the contact area CNA. This is because, the thicker the first passivation layer 118, the wider the deposition area and contact area of the electrode layers that may penetrate into its sidewall.

Thus, in the first example embodiment of the present disclosure, the organic emissive layer 122 can be short-circuited simply by increasing the thickness of the passivation layers 118 and 119 in the contact area CNA, and at the same time the auxiliary line AUX and the common electrode layer 123 may be brought into contact with each other. Due to this, when the common electrode layer 123 is formed, it may come into electrical contact with the second pixel electrode layer portion 120b at the uppermost part of the auxiliary line AUX. Therefore, the first example embodiment of the present disclosure can simplify the process as compared to the test example. The first example embodiment of the present disclosure is useful for, but is not limited to, a structure in which an auxiliary line is added and brought into contact with a common electrode layer to overcome the problem of resistance increase caused by the materials of electrode layers used especially in top-emission displays, and also may be used to reduce the resistance of bottom-emission displays.

Second Example Embodiment

Figure 16:
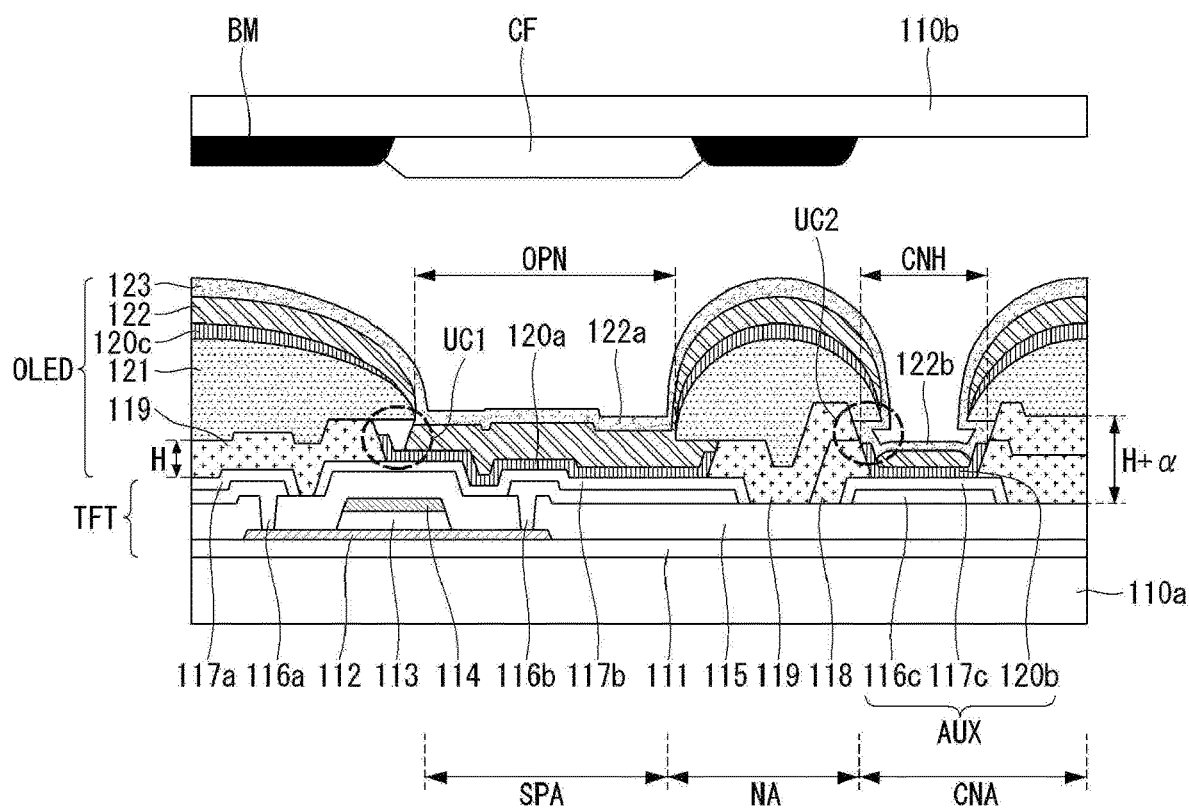
FIG. 16 is a cross-sectional view of a portion of the display panel according to a second example embodiment of the present disclosure.

FIG. 16 is a cross-sectional view of a portion of the display panel according to a second example embodiment of the present disclosure.

As shown in the FIG. 16 example, the display panel according to the second example embodiment may include a first substrate 110a, a transistor TFT, an organic light-emitting diode OLED, a black matrix layer BM, a color filter layer CF, and a second substrate 110b. The transistor TFT, the organic light-emitting diode OLED, and the color filter layer CF may be included in a light-emitting area SPA of a subpixel.

Similarly to the first example embodiment, the display panel according to the second example embodiment can simplify the process compared to the test example because, when the common electrode layer 123 is formed, it may come into electrical contact with the second pixel electrode layer portion 120b at the uppermost part of the auxiliary line AUX.

The display panel according to the second example embodiment is different from that of the first example embodiment in that it has the black matrix layer BM and the color filter layer CF, and the third pixel electrode 120c is on the organic insulating layer 121. As another example, a black base material may be included in one or more of: the first passivation layer 118, the second passivation layer 119, and the organic insulating layer 121. When the display panel according to the second example embodiment has the color filter layer CF, the organic emissive layer 122 may be made of a material that may emit white light. Moreover, in the display panel according to the second example embodiment, the third pixel electrode layer 120 is not removed, but may be left on the organic emissive layer 121, e.g., to simplify the manufacturing process. However, this is merely an example, and the third pixel electrode layer portion 120c on the organic emissive layer 121 may be removed, as described in the first example embodiment.

Third Example Embodiment

FIGS. 17 to 19 illustrate examples of an array of auxiliary lines according to a third example embodiment of the present disclosure.

Figure 17A:
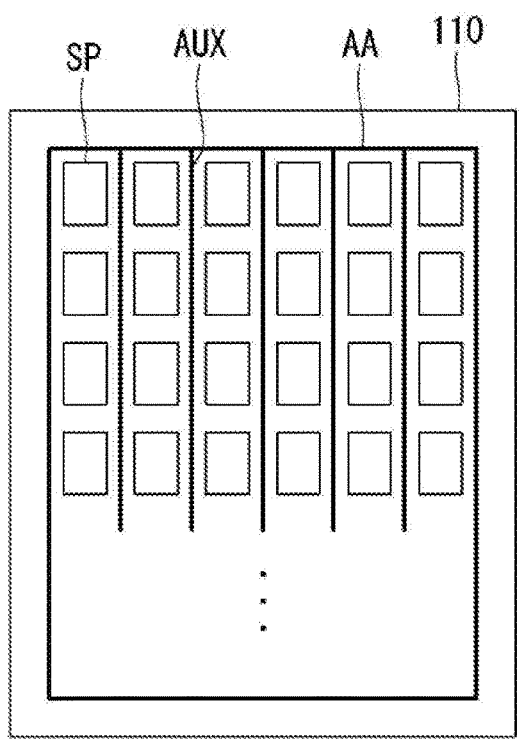
FIGS. 17A to 19B illustrate examples of an array of auxiliary lines according to a third example embodiment of the present disclosure.
Figure 17B:
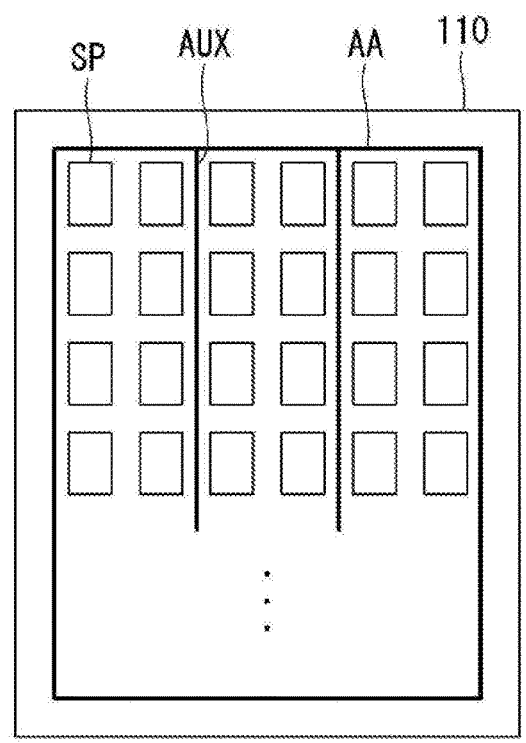

As shown in the examples of FIGS. 17A and 17B, the auxiliary line AUX described above in the foregoing first and second example embodiments may be arranged vertically in the display area AA of the display panel 110, e.g., in the same direction as the data lines DL1 to DLn. The auxiliary line AUX may be disposed between every column of subpixels SP, as shown in FIG. 17A, or may be placed between at least every second column of subpixels SP, as shown in FIG. 17B.

Figure 18A:
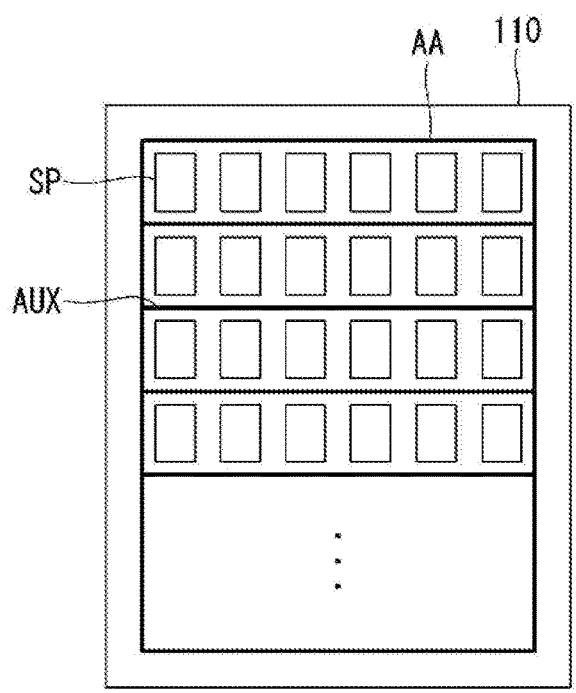
Figure 18B:
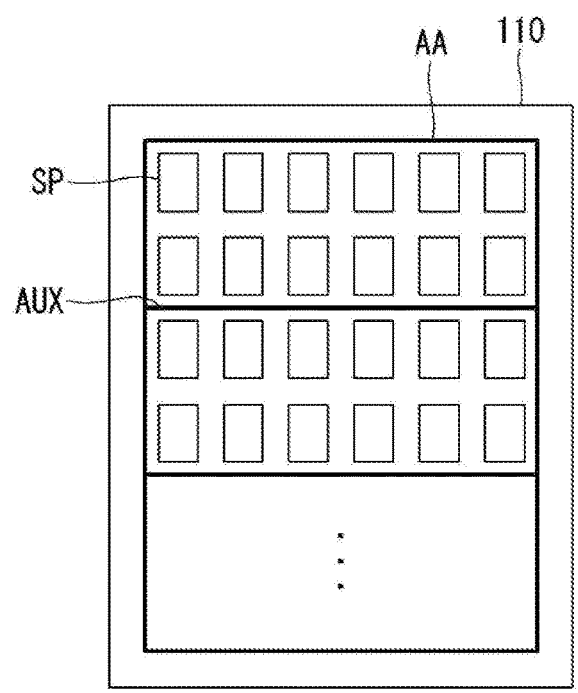

As shown in the examples of FIGS. 18A and 18B, the auxiliary line AUX described above in the foregoing first and second example embodiments may be arranged horizontally in the display area AA of the display panel 110, e.g., in the same direction as the scan lines GL1 to GLm. The auxiliary line AUX may be disposed between every row of subpixels SP, as shown in FIG. 18A, or may be disposed between at least every second row of subpixels SP as shown in FIG. 18B.

Figure 19A:
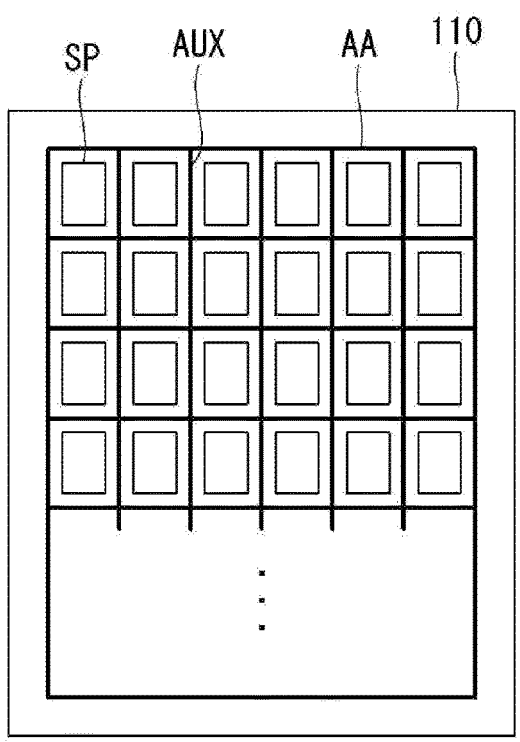
Figure 19B:
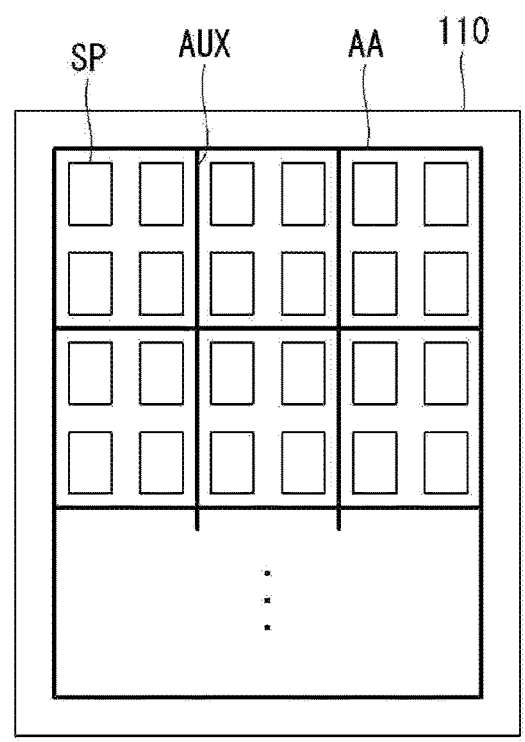

As shown in the examples of FIGS. 19A and 19B, the auxiliary line AUX described above in the foregoing first and second example embodiments may be arranged vertically and horizontally in the display area AA of the display panel 110. The auxiliary line AUX may be disposed between every column of subpixels SP and between every row of subpixels SP as shown in FIG. 19A, or may be disposed between at least every second column of subpixels SP and between at least every second row of subpixels SP as shown in FIG. 19B.

Therefore, the auxiliary line AUX may be in the display area AA of the display panel 110, e.g., to help reduce the resistance of the common electrode layer 123, and may be arranged in the form of a line or in the form of a mesh. Furthermore, the auxiliary line AUX may be on the outer side of the display area AA of the display panel 110, as well as on the inner side of the display area AA. The auxiliary line on the outer side of the display area AA may be configured to surround at least two, three, or four sides of the display area AA.

As viewed from above, when an auxiliary line is formed to reduce the resistance of the display panel, embodiments of the present disclosure may simplify the manufacturing process so that the auxiliary line and the common electrode layer may come into direct contact with each other through a deposition process. Moreover, embodiments of the present disclosure may improve brightness uniformity on a large-area display panel because the resistance of the display panel may be reduced using the common electrode layer and the auxiliary line. Furthermore, embodiments of the present disclosure may allow for the self-alignment of pixel electrode layers based on an undercut structure, and may reduce the number of masks used.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. A light-emitting display device, comprising:
a first substrate;
an interlayer insulating layer on the first substrate;
a subpixel on the substrate, the subpixel comprising:
   a light-emitting area; and
   a non-light-emitting area;
a contact area on the first substrate;
a metal layer on the interlayer insulating layer on the first substrate, the metal layer comprising a plurality of metal layer portions, the plurality of metal layer portions comprising:
   first and second metal layer portions disposed separately in the light-emitting area and in the non-light-emitting area; and
   a third metal layer portion disposed in the contact area;
a cover layer comprising a plurality of cover layer portions comprising first to third cover layer portions disposed separately and respectively corresponding to the first to third metal layer portions;
a first passivation layer covering the third cover layer portion in the contact area, the first passivation layer exposing part of the third cover layer portion;
a second passivation layer covering the first cover layer portion and the second cover layer portion, exposing part of the second cover layer portion, and exposing part of the third cover layer portion;
a pixel electrode layer comprising a plurality of pixel electrode layer portions comprising:
   a first pixel electrode layer portion on the second cover layer portion; and
   a second pixel electrode layer portion on the third cover layer portion;
an organic insulating layer on the second passivation layer, the organic insulating layer comprising:
   an opening exposing part of the first pixel electrode layer; and
   a contact hole exposing part of the second pixel electrode layer;
an organic emissive layer on the organic insulating layer and the first and second pixel electrode layers; and
a common electrode layer on the organic emissive layer, the common electrode layer being electrically connected to the second pixel electrode layer in the contact area,
wherein the opening comprises a first undercut shape including a recess of the second passivation layer into the bottom of the organic insulating layer partially exposing the bottom of the organic insulating layer,
wherein the contact hole comprises a second undercut shape including a recess of the first passivation layer and the second passivation layer into the bottom of the organic insulating layer partially exposing the bottom of the organic insulating layer,
wherein at least a portion of the second passivation layer is disposed on the first passivation layer and overlaps the first passivation layer,
wherein the first passivation layer and the second passivation layer have different thicknesses,
wherein the first passivation layer directly contacts the second pixel electrode layer portion and the third cover layer portion, and
wherein the second passivation layer directly contacts the first pixel electrode layer portion and the second cover layer portion.

2. The light-emitting display device of claim 1, wherein the height of the second undercut shape is greater than the height of the first undercut shape.

3. The light-emitting display device of claim 2, wherein, in a space under the second undercut shape, the second pixel electrode layer directly contacts a sidewall of at least one of the first and second passivation layers.

4. The light-emitting display device of claim 3, wherein the common electrode layer and the second pixel electrode layer electrically contact each other on the sidewall of the first passivation layer exposed in the contact area.

5. The light-emitting display device of claim 3, wherein the common electrode layer is over all layers exposed in the contact area.

6. The light-emitting display device of claim 1, wherein a first portion of the organic emissive layer on the organic insulating layer and a second portion of the organic emissive layer on the first pixel electrode layer are separated from each other by the first undercut shape.

7. The light-emitting display device of claim 1, further comprising a black base material in one or more of: the first passivation layer, the second passivation layer, and the organic insulating layer.

8. The light-emitting display device of claim 1, wherein:
the first pixel electrode layer portion and the common electrode are separated from each other by the first undercut shape; and
the second pixel electrode layer portion directly contacts the common electrode.

9. The light-emitting display device of claim 1, further comprising a third pixel electrode portion on the organic insulating layer.

10. A light-emitting display device, comprising:
a first substrate;
a subpixel on the substrate, the subpixel comprising:
a light-emitting area; and
a non-light-emitting area;
a contact area on the first substrate;
a cover layer comprising a plurality of cover layer portions comprising first to third cover layer portions, each of the first to third cover layer portions being separated from each other;
a first passivation layer covering the third cover layer portion in the contact area, the first passivation layer exposing part of the third cover layer portion;
a second passivation layer covering the first cover layer portion and the second cover layer portion, exposing part of the second cover layer portion, and exposing part of the third cover layer portion;
a pixel electrode layer comprising a plurality of pixel electrode layer portions comprising:
a first pixel electrode layer portion on the second cover layer portion; and
a second pixel electrode layer portion on the third cover layer portion;
an organic insulating layer on the second passivation layer, the organic insulating layer comprising:
an opening exposing part of the first pixel electrode layer; and
a contact hole exposing part of the second pixel electrode layer;
an organic emissive layer on the organic insulating layer and the first and second pixel electrode layers; and
a common electrode layer on the organic emissive layer, the common electrode layer being electrically connected to the second pixel electrode layer in the contact area,
wherein the opening comprises a first undercut shape including a recess of the second passivation layer into the bottom of the organic insulating layer partially exposing the bottom of the organic insulating layer,
wherein the contact hole comprises a second undercut shape including a recess of the first passivation layer and the second passivation layer into the bottom of the organic insulating layer partially exposing the bottom of the organic insulating layer,
wherein a distance between the third cover layer portion and the organic insulating layer is different from a distance between the first cover layer portion and the organic insulating layer,
wherein at least a portion of the second passivation layer is disposed on the first passivation layer and overlaps the first passivation layer,
wherein the first passivation layer and the second passivation layer have different thicknesses,
wherein the first passivation layer directly contacts the second pixel electrode layer portion and the third cover layer portion, and
wherein the second passivation layer directly contacts the first pixel electrode layer portion and the second cover layer portion.

11. The light-emitting display device of claim 10, wherein, in a space under the second undercut shape, the second pixel electrode layer directly contacts a sidewall of at least one of the first and second passivation layers.

12. The light-emitting display device of claim 11, wherein the common electrode layer and the second pixel electrode layer electrically contact each other on the sidewall of the first passivation layer exposed in the contact area.

13. The light-emitting display device of claim 11, wherein the common electrode layer is over all layers exposed in the contact area.

14. The light-emitting display device of claim 10, further comprising a black base material in one or more of: the first passivation layer, the second passivation layer, and the organic insulating layer.

\* \* \* \* \*